United States Patent
Chang et al.

(10) Patent No.: US 8,916,930 B2
(45) Date of Patent: Dec. 23, 2014

(54) TRENCHED POWER SEMICONDUCTOR DEVICE AND FABRICATION METHOD THEREOF

(75) Inventors: Yuan-Shun Chang, Taipei (TW); Yi-Yun Tsai, Penghu County (TW); Kao-Way Tu, New Taipei (TW)

(73) Assignee: Super Group Semiconductor Co., Ltd., New Taipei (TW)

( * ) Notice: Subject to any disclaimer, the term of this patent is extended or adjusted under 35 U.S.C. 154(b) by 709 days.

(21) Appl. No.: 13/223,603

(22) Filed: Sep. 1, 2011

(65) Prior Publication Data

US 2013/0056821 A1 Mar. 7, 2013

(51) Int. Cl.

| H01L 29/78 | (2006.01) |
|---|---|
| H01L 21/336 | (2006.01) |
| H01L 29/66 | (2006.01) |
| H01L 29/417 | (2006.01) |
| H01L 29/40 | (2006.01) |
| H01L 29/06 | (2006.01) |
| H01L 21/74 | (2006.01) |
| H01L 29/423 | (2006.01) |
| H01L 29/08 | (2006.01) |

(52) U.S. Cl.
CPC ........... *H01L 29/7809* (2013.01); *H01L 29/407* (2013.01); *H01L 29/0653* (2013.01); *H01L 29/0623* (2013.01); *H01L 29/66719* (2013.01); *H01L 29/66727* (2013.01); *H01L 29/7811* (2013.01); *H01L 29/41766* (2013.01); *H01L 21/74* (2013.01); *H01L 29/42368* (2013.01); *H01L 29/7812* (2013.01); *H01L 29/7813* (2013.01); *H01L 29/66734* (2013.01); *H01L 29/0878* (2013.01)
USPC .......................................... 257/334; 257/335

(58) Field of Classification Search
USPC ...................... 257/328–343, E29.262, E21.41
See application file for complete search history.

(56) References Cited

U.S. PATENT DOCUMENTS

| 7,087,958 B2 * | 8/2006 | Chuang et al. ................. 257/335 |
| 2012/0299091 A1 * | 11/2012 | Tsai et al. ....................... 257/334 |

* cited by examiner

*Primary Examiner* — Cuong Q Nguyen
(74) *Attorney, Agent, or Firm* — Rosenberg, Klein & Lee

(57) ABSTRACT

A trenched power semiconductor device on a lightly doped substrate is provided. The device has a base, a plurality of trenches including at least a gate trench, a plurality of first heavily doping regions, a body region, a source doped region, a contact window, a second heavily doped region, and a metal layer. The trenches are formed in the base. The first heavily doped regions are beneath the trenches respectively and spaced from the bottom of the respective trench with a lightly doped region. The body region encircles the trenches and is away from the first heavily doped region with a predetermined distance. The source doped region is in an upper portion of the body region. The contact window is adjacent to the edge of the base. The second heavily doped region is below the contact window filled by the metal layer for electrically connecting the second heavily doped region.

9 Claims, 13 Drawing Sheets

TRENCHED POWER SEMICONDUCTOR DEVICE AND FABRICATION METHOD THEREOF

BACKGROUND OF THE INVENTION

1. Field of the Invention

This invention relates to a power semiconductor device and a fabrication method thereof, and more particularly relates to a trenched power semiconductor device and a fabrication method thereof.

2. Description of the Prior Art

A typical planar power semiconductor device has the gate electrode placed over the substrate for generating a conductive current flowing along the surface of the substrate. The reduction of cell pitch is thus constrained by the formation of the planar gate electrode. In contrast with the planar device, the trenched one has the gate electrode placed in a vertical trench for generating a vertical conductive current in replace of the horizontal conductive current. Therefore, the distance between neighboring cells can be reduced and layout integration can be improved.

FIG. 1 is a cross-section view of a typical trenched metal oxide semiconductor field effect transistor (MOSFET). As shown, the trenched MOSFET has an N-type heavily doped substrate 10, an N-type lightly doped epitaxial layer 12, a plurality of gate trenches 14, a plurality of gate structures 16, a plurality of P-type bodies 17, a plurality of source regions 18, and an interlayer dielectric layer 19. The N-type lightly doped epitaxial layer 12 is located on the N-type heavily doped substrate 10. The gate trenches 14 are located in the N-type lightly doped epitaxial layer 12. The gate structures 16 are located in the respective gate trenches 14. The P-type bodies 17 are located in an upper portion of the N-type lightly doped epitaxial layer 12, and the gate trenches 14 are encircled by the P-type bodies 17. The gate structures 16 are covered with a gate dielectric layer 15 so as to electrically isolate the gate structures 16 from the P-type bodies 17 and the N-type lightly doped epitaxial layer 12. The source regions 18 are located in a surface layer of the P-type bodies 17, and the gate trenches 14 are encircled by the source regions 18. The interlayer dielectric layer 19 is deposited over the gate structures 16 and has a plurality of source contact windows formed therein to expose the source regions 18.

In general, source voltage of the trenched MOSFET is applied to the source regions 18 through a source metal pad (not shown in this figure) located above the interlayer dielectric layer 19, the gate voltage is applied to the gate structures 16 through a gate metal pad (not shown in this figure) located above the interlayer dielectric layer 19, and the drain voltage is applied to the N-type heavily doped substrate 10 through a drain metal pad (not shown in this figure) located on a lower surface of the N-type heavily doped substrate 10. The bonding steps for connecting the metal pads on the both sides of the substrate 10 to the lead frame may results in an unwanted limitation to the packaging process.

Accordingly, how to overcome the above mentioned drawbacks without complicating the structure and the fabrication method of the trenched power semiconductor devices, is an important issue in this technology field.

SUMMARY OF THE INVENTION

It is a main object of the present invention to provide a trenched power semiconductor device with the source metal pad, the gate metal pad, and the drain metal pad placed at the same side of the substrate and simply the fabrication method thereof at the same time for reducing fabrication cost.

For achieving the above mentioned object, a trenched power semiconductor device is provided in accordance with a preferred embodiment of the present invention. The trenched power semiconductor device has a base, a plurality of trenches, at least a gate polysilicon structure, a gate dielectric layer, a plurality of first heavily doped regions, at least a body, at least a source region, an interlayer dielectric layer, a drain contact window, a second heavily doped region, and a metal layer. The trenches, which include at least a gate trench, are located in the base. The gate polysilicon structure is located in the gate trench. The gate dielectric layer encircles a side surface and a bottom of the gate polysilicon structure. The first heavily doped regions are located below at least some of the trenches and spaced from bottoms of the respective trenches with a lightly doped layer. The first heavily doped regions are overlapped with each other to form a conductive path. The body encircles the gate trench and is spaced from the first heavily doped region with a predetermined distance. The source region is located in an upper portion of the body. The interlayer dielectric layer covers the gate polysilicon structure and has at least a source contact window therein to expose the source region. The drain contact window is located near an edge of the base. The second heavily doped region is locate below the drain contact window and electrically connected to the conductive path. The metal layer fills the drain contact window and is electrically connected to the second heavily doped region.

According to an embodiment of the present invention, the base is a lightly doped substrate.

According to an embodiment of the present invention, the base is composed of a substrate and an epitaxial layer located thereon.

According to an embodiment of the present invention, the base is composed of a substrate covered with an oxide layer and an epitaxial layer located on the oxide layer.

According to an embodiment of the present invention, the trenches in the base include the gate trenches, the first trenches, and the second trenches. The second trench is located between neighboring gate trenches for locating a dielectric structure. The first trench is located in the epitaxial layer outside the gate trench for locating a termination structure.

According to an embodiment of the present invention, the trenches formed in the base are sorted into a first group and a second group. The first group of trenches has a greater width with respect to the second group, and a narrow trench is formed at the bottom of each of the first group of trenches. The first heavily doped region is located below the narrow trench.

Based on the above mentioned trenched power semiconductor device, a fabrication method thereof is provided. The fabrication method comprises the steps of: (a) providing a base; (b) forming a pattern layer over the base to define a plurality of trenches including at least a gate trench; (c) etching the base to form the trenches; (d) implanting impurities of a first conductive type into the base below at least some of the trenches to form a plurality of first heavily doped regions overlapped with each other to form a conductive path in a following thermal process, and each of the first heavily doped regions spaced from a bottom of the respective trench with a lightly doped layer; (e) forming a gate dielectric layer to line an inner surface of the gate trench; (f) forming at least a gate polysilicon structure in the gate trench; (g) forming at least a body to encircle the gate trench; (h) forming at least a source region in an upper portion of the body; (i) forming an interlayer dielectric layer on the base to cover the gate polysilicon structure with at least a source contact window to expose the source region; (j) forming a drain contact window near an edge of the base; and (k) filling a metal layer into the drain contact window to electrically connect the conductive path.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The trenched power semiconductor device provided in the present invention features a trench bottom ion implantation process for forming the heavily doped regions below the trenches as the conductive path extending to the drain electrode so as to simplify the structure and reduce the fabrication cost.

FIGS. 2A to 2J are schematic views showing a fabrication of a trenched power semiconductor device in accordance with a first embodiment of the present invention, and a trenched power MOSFET is disclosed as an example. However, the present invention is not so restricted. The technology taught in the present invention may be applied to the formation of other power semiconductor devices, such as the insulated gate bipolar transistor (IGBT).

Figure 1:
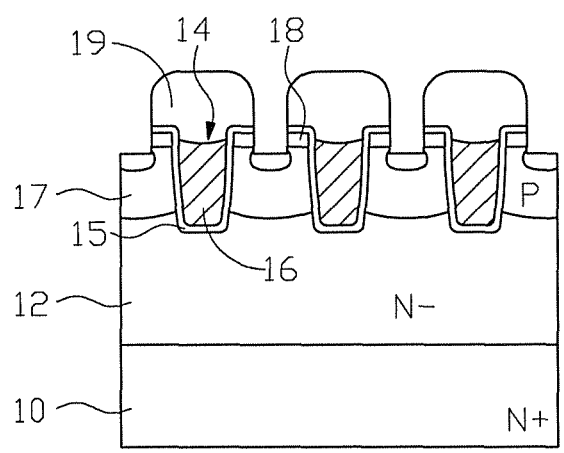
FIG. 1 is a cross-section view of a typical trenched metal oxide semiconductor field effect transistor (MOSFET).
Figure 2A:
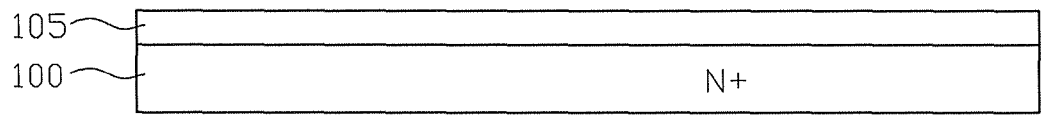
FIGS. 2A to 2J are schematic views showing a fabrication method of a trenched power semiconductor device in accordance with a first embodiment of the present invention.
Figure 2B:
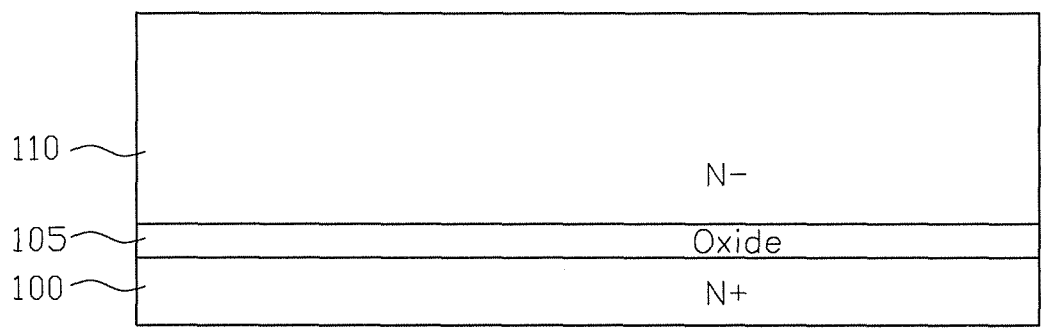
Figure 2C:
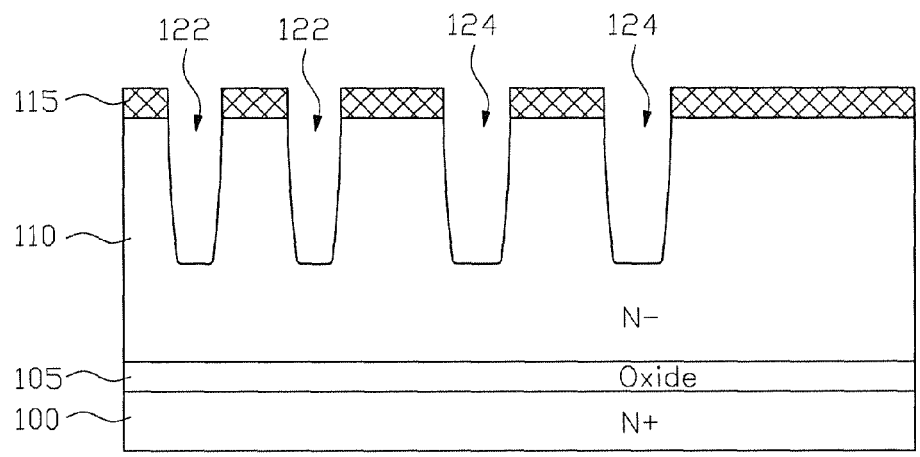

As shown in FIG. 2A, firstly, an insulating layer 105, such as an oxide layer, is formed on an N-type heavily doped substrate 100. Then, as shown in FIG. 2B, an N-type lightly doped epitaxial layer 110 is formed on the insulating layer 105. The selection of N-type heavily doped substrate 100 and the N-type lightly doped epitaxial layer 110 in the present embodiment is for matching the typical fabrication process of trenched MOSFET so as to prevent the increasing of fabrication cost. However, the present invention is not so restricted. The substrate of different conductive type or with different doping concentration may be applied in the present embodiment. Thereafter, as shown in FIG. 2C, a pattern layer 115 is formed on the epitaxial layer 110 to define a plurality of trenches 122,124 in the epitaxial layer 110. In the present embodiment, the trenches defined by the pattern layer 115 include the gate trenches 122 for locating the gate structures and the first trenches 124 for forming the termination structures. However, the present invention is not so restricted. The other trenched structures of the semiconductor device, such as the gate bus, can be defined in the present step.

Figure 2D:
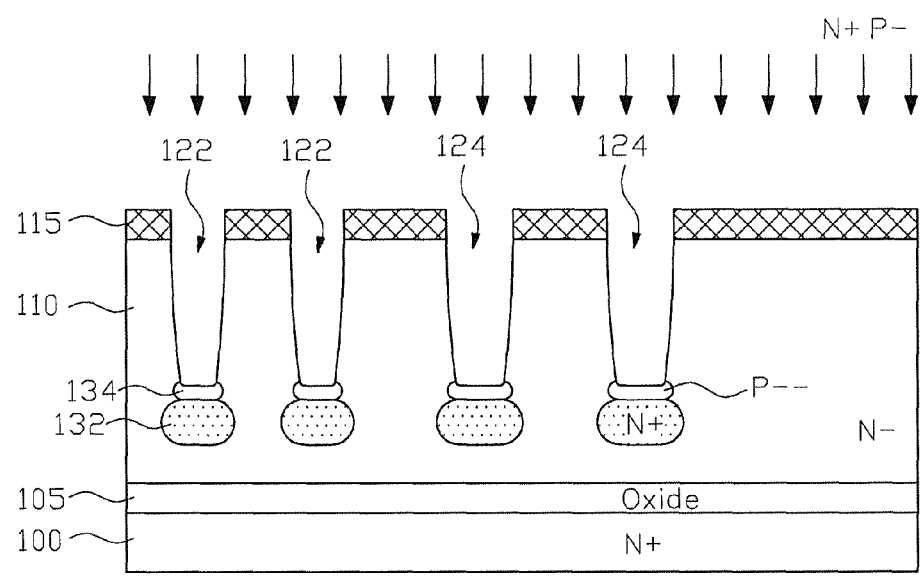

Thereafter, as shown in FIG. 2D, by using the pattern layer 115 over the epitaxial layer 110 as an implantation mask, an ion implantation step is carried out to implant N-type impurities into the epitaxial layer 110 below the trenches 122,124 so as to form a plurality of N-type first heavily doped regions 132 below the trenches 122,124. In the present embodiment, a high energy ion implantation technology is used for increasing implantation depth such that the first heavily doped regions 132 formed below the trenches 122,124 are not adjacent to the bottom of the trenches 122,124, but are deeply inside the epitaxial layer 110 below the trenches 122,124. Thereafter, another ion implantation step is carried out to implant P-type impurities into the epitaxial layer 110 below the trenches 122,124 to form a plurality of P-type lightly doped regions 134 in the epitaxial layer 110. It is noted that the implantation depth of the present ion implantation step is smaller than that for forming the first heavily doped regions 132. Thus, the P-type lightly doped regions 134 are located between the trenches 122,124 and the N-type first heavily doped regions 132 to hinder upward expansion of the N-type first heavily doped region 132 so as to maintain a sufficient distance between the N-type first heavily doped region 132 and the gate trench 122 to prevent the gate-to-drain capacitor from being punched through.

In the above mentioned, the lightly doped regions 134 is P-type, but its not limited to P-type. Depending on the amount of impurities being implanted, the lightly doped regions 134 may be of N-type. As the lightly doped regions 134 is N-type and the doping concentration of the N-type lightly doped regions 134 is much less than the original doping concentration of the epitaxial layer 110, the horizontal diffusing speed of the N-type first heavily doped region 132 is more than upward diffusing speed. (The amount of the N-type dopant in horizontal direction is less than that in upward direction for achieving a predetermined doping concentration.) Therefore the N-type lightly doped regions 134 can achieve the similar object.

In the above mentioned fabrication steps, the heavily doped regions 132 are formed in the step prior to the formation of the lightly doped regions 134. However, the present invention is not so restricted. The step of forming the lightly doped regions 134 may be carried out prior to the step of forming the heavily doped regions 132.

Figure 2E:
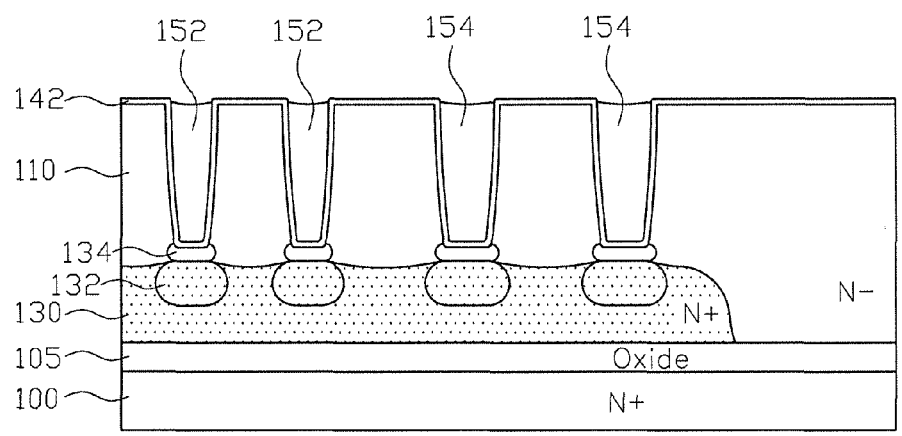

Next, as shown in FIG. 2E, a gate dielectric layer 142 is formed on the inner surface of the trenches 122,124. Then, the trenches 122,124 are filled with polysilicon material to form a gate polysilicon structure 152 and a termination structure 154 in the gate trench 122 and the first trench 124 respectively. There would be a significant expansion of the first heavily doped regions 132 in the step of forming the gate dielectric layer 142, which is usually carried out in a high temperature environment. The high temperature environment is helpful for establishing the connection between the neighboring first heavily doped regions 132 to form a conductive path 130. Certainly, as to a preferred embodiment of the present invention, an additional annealing step may be added after the step of forming the first heavily doped regions 132 to make sure that the conductive path 130 composed of the overlapped first heavily doped regions 132 is formed.

Figure 2F:
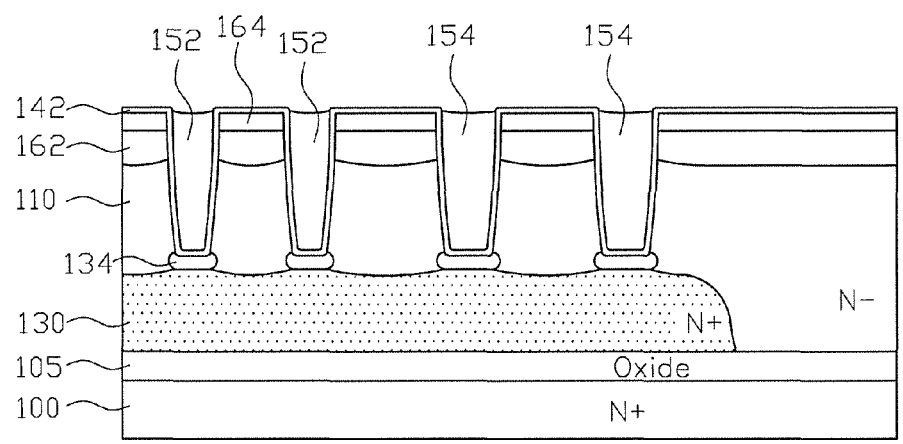

Next, as shown in FIG. 2F, an ion implantation step is carried out to implant P-type impurities into the epitaxial layer 110 so as to form the body regions 162 in an upper portion of the epitaxial layer 110 to encircle the gate trenches 122. Thereafter, another ion implantation step is carried out to implant N-type impurities into the surface layer of the body regions 162 so as to form the source regions 164 in an upper portion of the body regions 162.

Figure 2G:
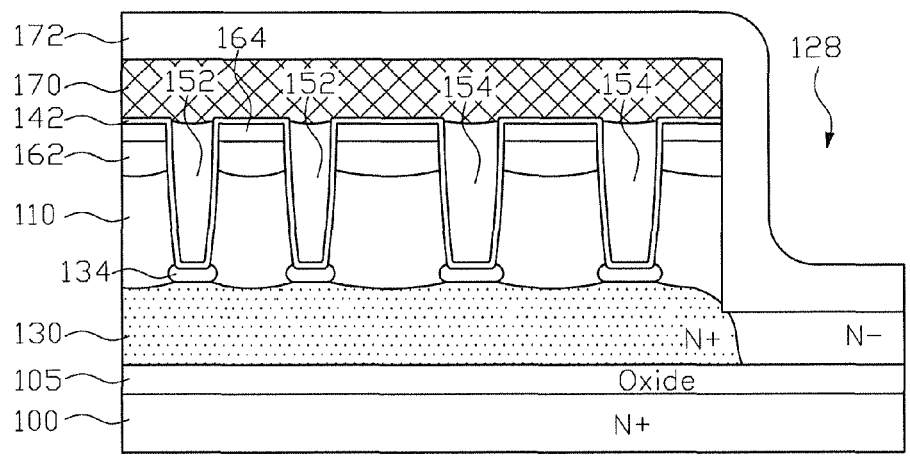
Figure 2H:
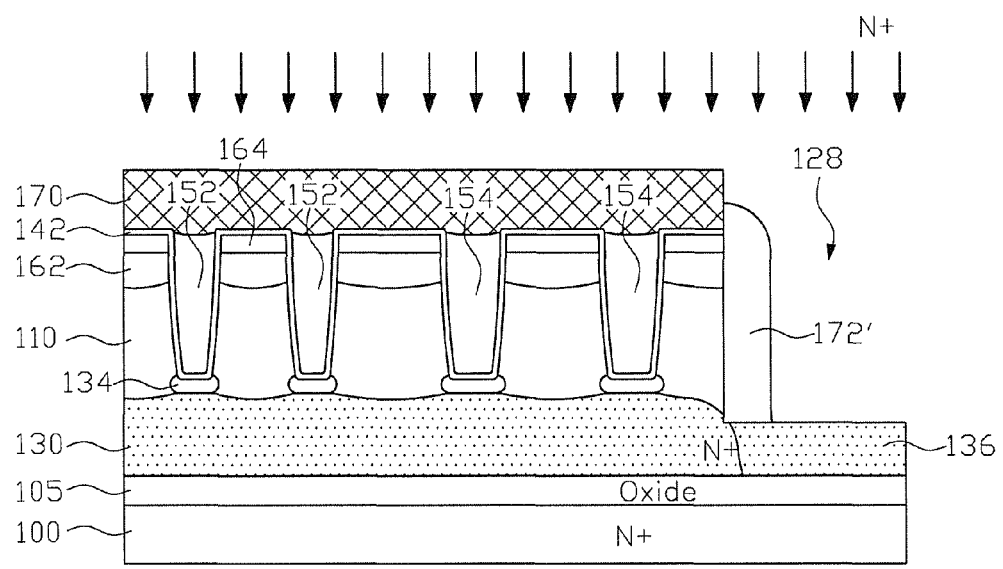

Next, as shown in FIGS. 2G and 2H, a pattern layer 170, such as a hard mask, is formed on the epitaxial layer 110 to define the location of a drain contact window 128. Thereafter, an etching step is used to etch the epitaxial layer 110 so as to form the drain contact window 128 near the edge of the epitaxial layer 110. Then, as shown in FIG. 2H, a passivation layer 172 is deposited along the contour of the epitaxial layer 110. Next, a portion of the passivation layer 172 is removed by etching to leave a sidewall protection layer 172' covering the sidewall of the drain contact window 128 for protecting the exposed epitaxial layer 110. Then, an ion implantation step is carried out to implant N-type impurities into epitaxial layer 110 below the bottom of the drain contact window 128 so as to form a second heavily doped region 136 horizontally extended to the conductive path 130 composed of the plurality of first heavily doped regions 132. The second heavily doped region 136 located between the drain metal layer and the conductive path 130 is helpful for reducing contact resistance.

Figure 2I:
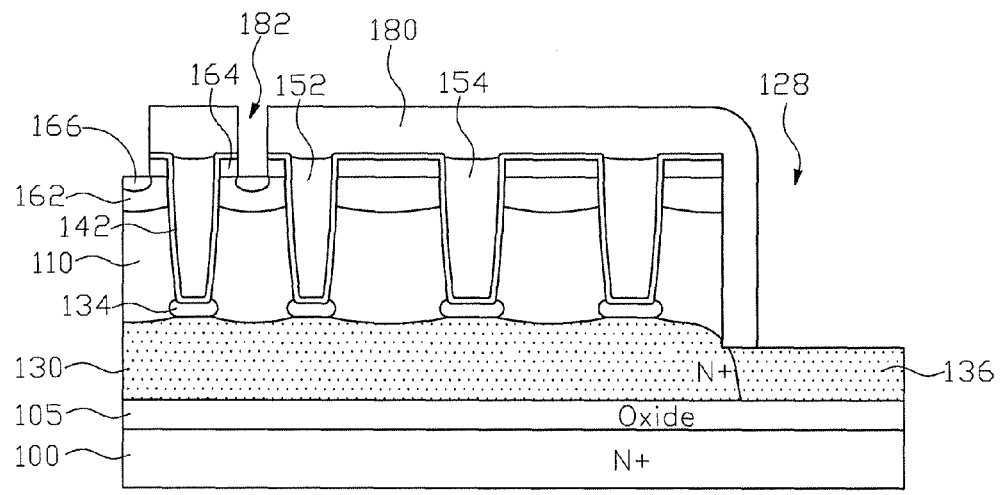
Figure 2J:
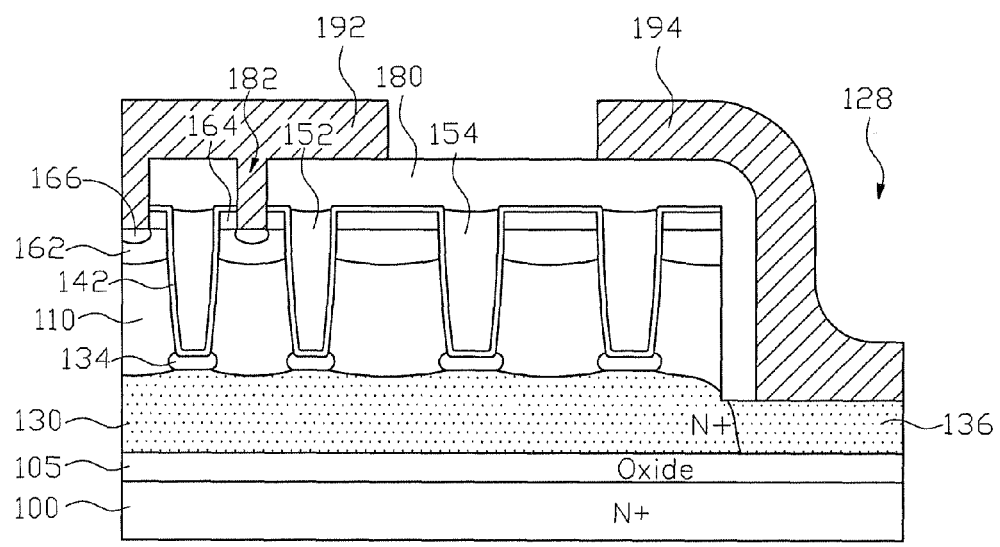

Next, as shown in FIG. 2I, the sidewall protection layer 172' and the pattern layer 170 are removed. Thereafter, an interlayer dielectric layer 180 is deposited along the contour of the epitaxial layer 110 and a lithographic and etching step follows to form a plurality of source contact windows 182 in the interlayer dielectric layer 180 to expose the source regions 164 and the body region 162. Then, a heavily doped region 166 is formed at the bottom of the source contact window 182. In the present etching step, the portion of the interlayer dielectric layer 180 on the bottom of the drain contact window 128 is also removed to expose the second heavily doped region 136, but the sidewall of the drain contact window 128 is still covered by the remained portion of the interlayer dielectric layer 180. Finally, as shown in FIG. 2J, a metal pattern layer is deposited on the interlayer dielectric layer 180. The metal pattern layer includes a source metal layer 192 filling the source contact window 182 for electrically connecting the source regions 164 and a drain metal layer 194 filling the drain contact window 128 for electrically connecting the conductive path 130.

Figure 3A:
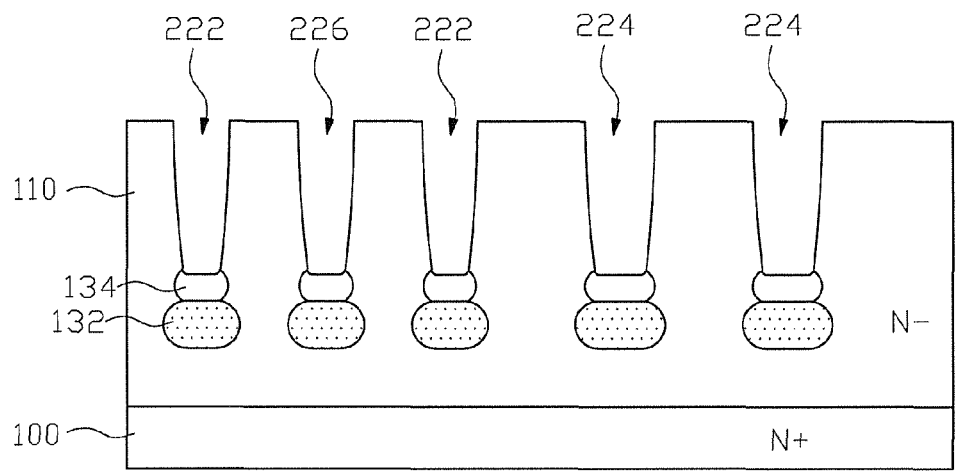
FIGS. 3A to 3C are schematic views showing a fabrication method of a trenched power semiconductor device in accordance with a second embodiment of the present invention.
Figure 3B:
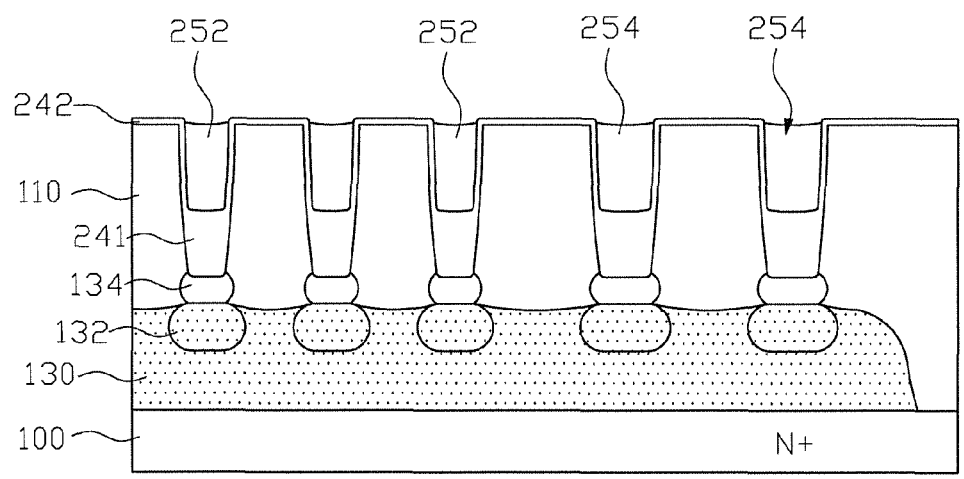
Figure 3C:
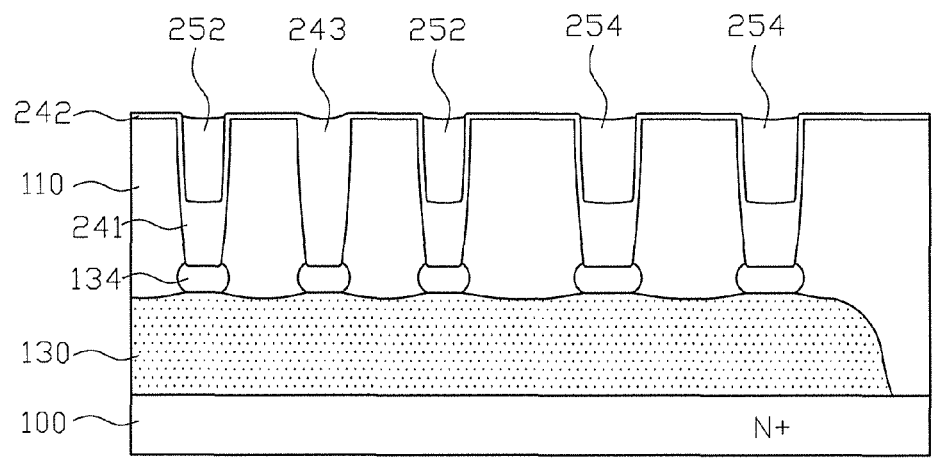

FIGS. 3A to 3C are schematic views showing a fabrication method of a trenched power semiconductor device in accordance with a second embodiment of the present invention. In contrast with the first embodiment of the present invention, the present embodiment as shown in FIG. 3A skips the insulating layer 105 and has the N-type epitaxial layer 110 formed on the substrate 100 directly. In addition to the gate trenches 222 and the first trenches 224, the pattern layer (not shown in this figure) in the present embodiment also defines a second trench 226 between the neighboring gate trenches 222.

As shown in FIG. 3B, after forming the first heavily doped regions 132 and the lightly doped regions 134 by using the ion implantation steps, a trench bottom dielectric structure 241, such as an oxide structure, is formed in a bottom portion of the trenches 222,224,226 to prevent the gate-to-drain capacitor of the power semiconductor device from being punched through. Then, a gate dielectric layer 242 is formed on the inner surface of the trenches 222,224,226. Afterward, a polysilicon layer is deposited into the trenches 222,224,226 so as to form a gate polysilicon structure 252 and a termination structure 254 in the gate trench 222 and the first trench 224 respectively. Thereafter, as shown in FIG. 3C, a pattern layer (not shown in this figure) is formed to shield the gate trench 222 and the first trench 224, and then an etching step is carried out to remove the unwanted polysilicon material in the second trench 226. The second trench 226 is then filled with dielectric material so as to form a dielectric plug 243 in the second trench 226.

The following steps of the present embodiment are substantially identical to that of the first embodiment except the steps relative to the formation of the second trench 226 between the neighboring gate trenches 222. That is, because of the formation of the second trench 226, the body regions 162 and the source regions 164 may encircle both the gate trenches 222 and the second trench 226, and the source contact window 182 would be substantially aligned to the second trench 226.

Figure 4A:
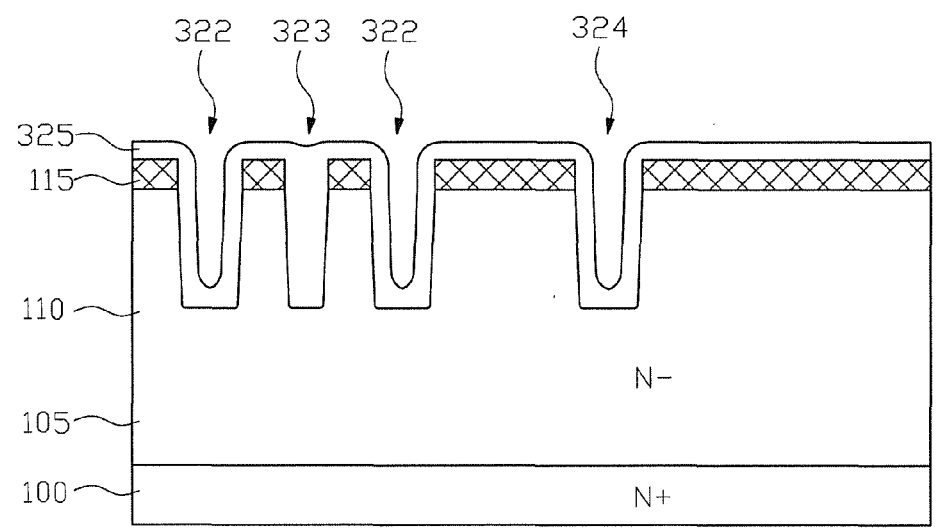
FIGS. 4A to 4C are schematic views showing a fabrication method of a trenched power semiconductor device in accordance with a third embodiment of the present invention.
Figure 4B:
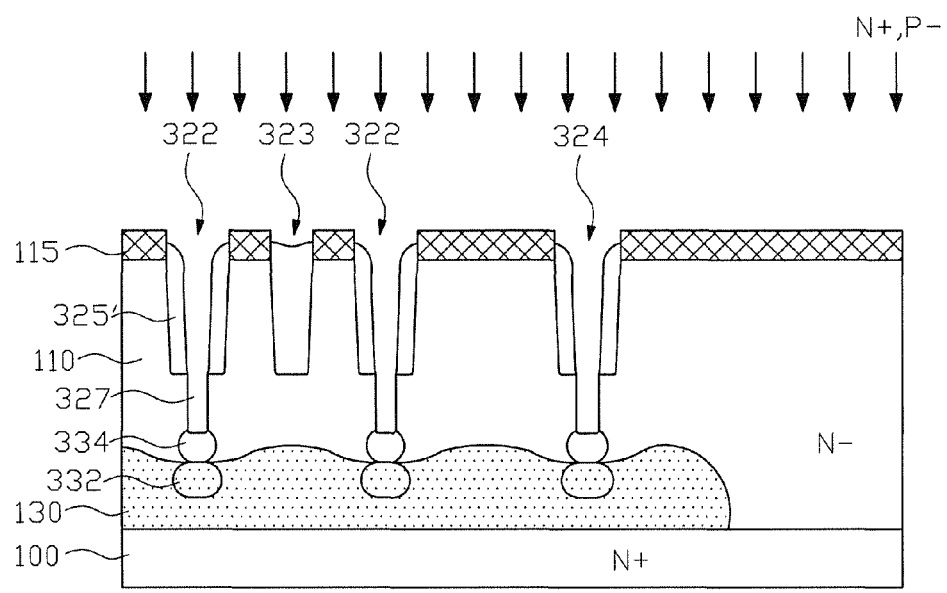
Figure 4C:
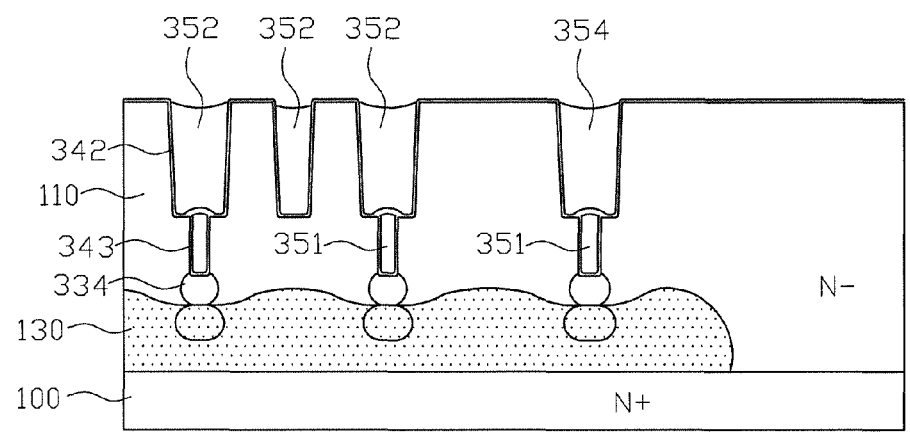

FIGS. 4A to 4C are schematic views showing a fabrication method of a trenched power semiconductor device in accordance with a third embodiment of the present invention. Different from the first embodiment of the present invention, which adopts a single etching step for forming the gate trenches in the epitaxial layer 110, the present embodiment adopts a two-stage etching steps for forming the gate trenches as shown in FIGS. 4A and 4B. Thus, in contrast with the trenches 122,124 in the first embodiment, which have substantially identical depth, the trenches in the present embodiment can be sorted into a first group of trenches 322,324 with a greater depth and a second group of trenches 323 with a smaller depth with respect to that of the first group.

As shown in FIG. 4A, after the formation of the epitaxial layer 110, a pattern layer is formed on the epitaxial layer 110 to define a plurality of trenches 322,324,323 in the epitaxial layer 110. It is noted that the width of the trenches are different. The defined trenches can be sorted into at least a first group of trenches 322,324 with a greater width and a second group of trenches 323 with a smaller width with respect to the first group. In the first-stage of the two-stage etching step, all the defined trenches 322,324,323 are formed in the epitaxial layer 110. After the first-stage of the two-stage etching step has completed, a passivation layer 325 is deposited along the contour of the epitaxial layer 110. The passivation layer 325 fills the second group of trenches 323 but leaves a space in the middle of the trenches 322,324 with a greater width. Thereafter, in the second-stage of the two-stage etching step, an anisotropic etching process is used to remove the portion of the passivation layer 325 at the bottom of the trenches 322, 324 and extend the trenches downward by forming a narrow trench 327 in the epitaxial layer 110 below the original trenches 322,324 by using a remained passivation layer 325' as an etching mask.

Then, by using the remained passivation layer 325' on the sidewall of the trenches 322,324 and the pattern layer 115 on the epitaxial layer 110 as an implantation mask, the ion implantation steps are carried out to form the first heavily doped regions 332 and the lightly doped regions 334 below the narrow trench 327. The detail fabrication process of the first heavily doped region 332 and the lightly doped region 334 may be referred to the above mentioned embodiment. Thereafter, as shown in FIG. 4C, a dielectric layer 343 is formed on the inner surface of the narrow trench 327, and then a polysilicon structure 351 is filled into the narrow trench 327. The polysilicon structure 351 may be floating or electrically connected to the source electrode. Thereafter, the remained passivation layer 325' is removed to expose the inner surface of the trenches 322,324,323. Then, a gate dielectric layer 342 is formed on the inner surface of the trenches 322,324,323 and a dielectric layer is also formed on the polysilicon structure 351 in the same step. Afterward, the trenches 322,324, 323 are filled with polysilicon material so as to form a gate polysilicon structure 352 and a termination structure 354. The following steps of the present embodiment are substantially identical to that of the first embodiment and thus are not repeated here. It is noted that, in the present embodiment, the first heavily doped regions 332 are formed below merely some of the trenches 322,324 instead of all the trenches as shown in the above mentioned embodiment.

Figure 5A:
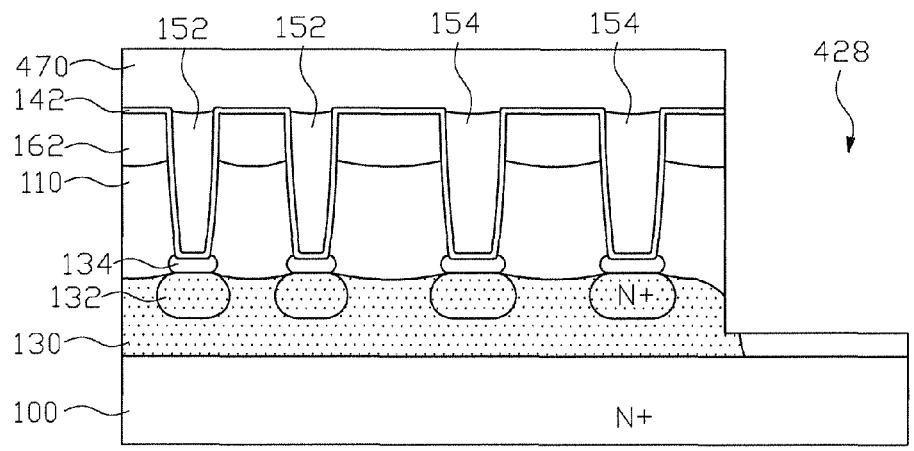
FIGS. 5A and 5B are schematic views showing a fabrication method of a trenched power semiconductor device in accordance with a fourth embodiment of the present invention.
Figure 5B:
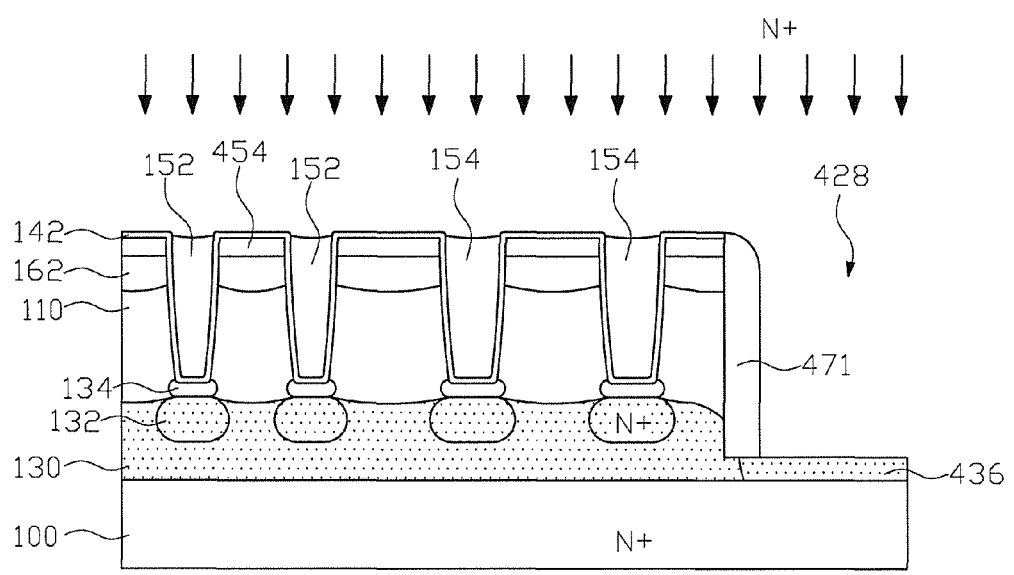

FIGS. 5A and 5B are schematic views showing a fabrication method of a trenched power semiconductor device in accordance with a fourth embodiment of the present invention. The step shown in FIG. 5A is next to the step of FIG. 2E. As shown, after the formation of the body region 162, a pattern layer 470 is formed on the epitaxial layer 110 to define the location of a drain contact window 428 first instead of forming the source region. Then, the drain contact window 428 is formed near the edge of the epitaxial layer 110 by using the pattern layer 470 as an etching mask. Afterward, as shown in FIG. 5B, the pattern layer 470 on the upper surface of the epitaxial layer 110 is removed to leave a sidewall protection structure 471 on the sidewall of the drain contact window 428. Thereafter, an ion implantation step is carried out to implant N-type impurities into the body region 162 so as to form the source regions 454 in the upper portion of the body region 162. In the present ion implantation step, the N-type impurities are also implanted into the bottom of the drain contact window 428 such that a second heavily doped region 436 is formed below the drain contact window 428. The following fabrication steps of the present embodiment are substantially identical to that of the first embodiment and thus are not repeated here.

Figure 6A:
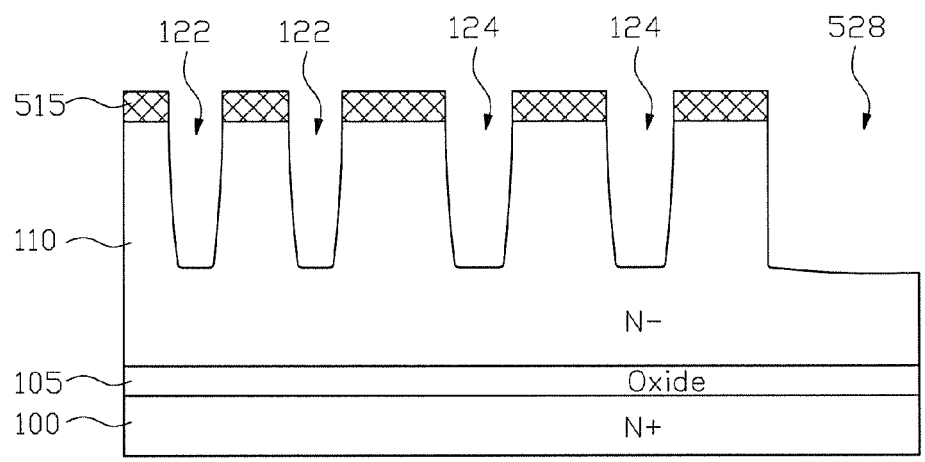
FIGS. 6A to 6E are schematic views showing a fabrication method of a trenched power semiconductor device in accordance with a fifth embodiment of the present invention.

FIGS. 6A to 6E are schematic views showing a fabrication method of a trenched power semiconductor device in accordance with a fifth embodiment of the present invention. A major difference between the present embodiment and the above mentioned embodiments lies in the timing for forming the drain contact window. In the present embodiment, the etching step for forming the gate trenches 122 is also utilized for forming the drain contact window 528 in the epitaxial layer 110. The fabrication step as shown in FIG. 6A is next to the step of FIG. 2B. Referring to FIG. 6A, a pattern layer 515 is formed on the epitaxial layer 110 to define the gate trenches 122, the first trenches 124, and the drain contact window 528 and then an etching step is carried out to form the gate trenches 122, the first trenches 124, and the drain contact window 528 in the epitaxial layer 110.

Figure 6B:
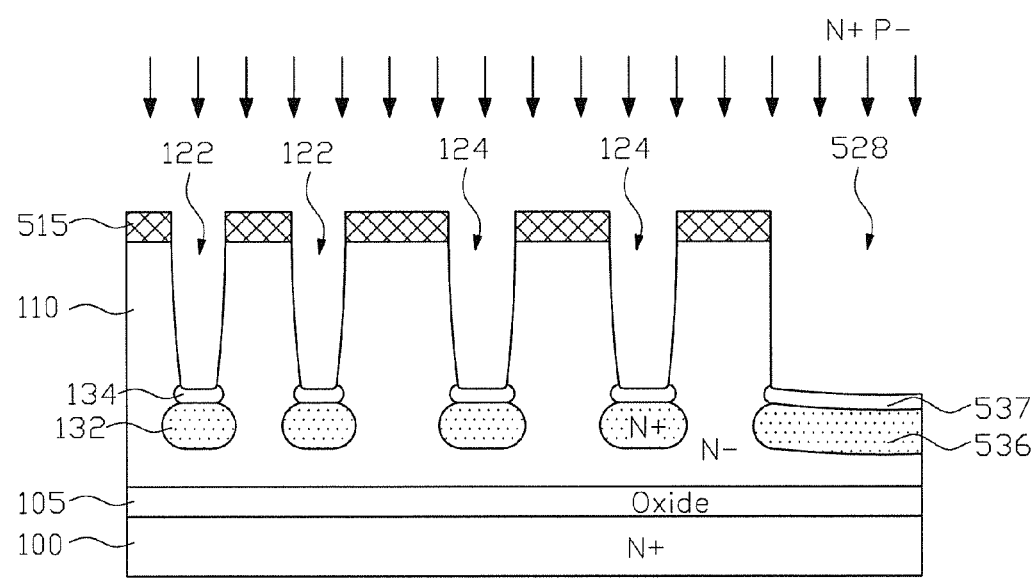
Figure 6C:
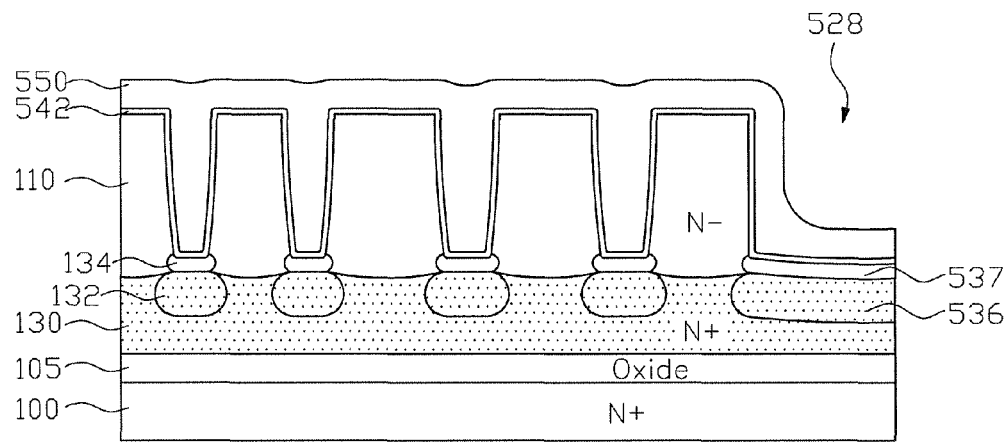

Afterward, as shown in FIG. 6B, the ion implantation steps are carried out for forming the N-type first heavily doped region 132 and the lightly doped region 134 below each of the trenches 122,124 respectively. Since the bottom of the drain contact window 528 is also exposed, an N-type second heavily doped region 536 and a lightly doped region 537 thereon are also formed below the drain contact window 528. Thereafter, as shown in FIG. 6C, a gate dielectric layer 542 is formed on the inner surface of the trenches 122,124 and the drain contact window 528. Then, a polysilicon layer 550 is deposited along the contour of the epitaxial layer 110 and fills the trenches 122,124.

Figure 6D:
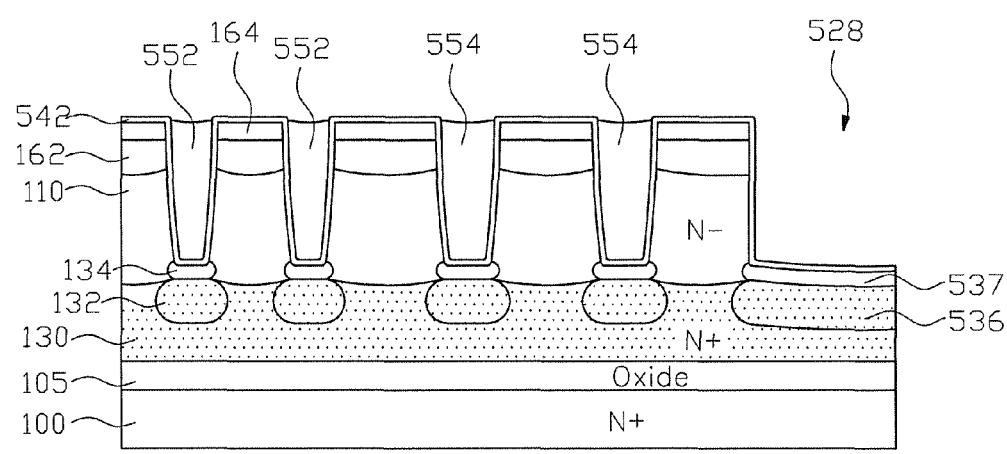

Thereafter, as shown in FIG. 6D, the unwanted portion of the polysilicon layer 550 is removed by etching back so as to leave a gate polysilicon structure 552 in the gate trench 122 and a termination structure 554 in the first trench 124. It should be noted that since a width of the drain contact window 528 is much larger than that of the gate trench 122 and the first trench 124, the portion of the polysilicon layer 550 in the drain contact window 528 would be totally removed in the etching step. Thereafter, the body region 162 and the source region 164 are formed in the upper portion of the epitaxial layer 110 by using ion implantation steps. It is noted that the ion implantation step for forming the body region 162 would not show any a significant influence to the exposed second heavily doped region 536 because the doping concentration of the second heavily doped region 536 is much higher than that of the body region 162. On the other hand, the ion implantation step for forming the source region 164 may enhance the doping concentration of the lightly doped region 537 so as to improve the resistance of the lightly doped region 537.

Figure 6E:
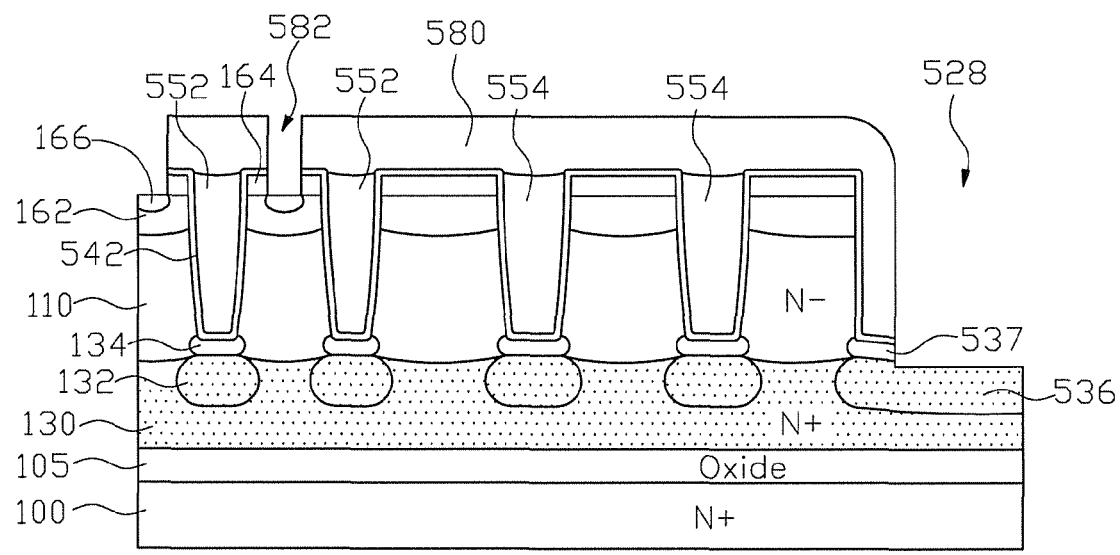

Thereafter, as shown in FIG. 6E, an interlayer dielectric layer 580 is deposited on the epitaxial layer 110. Then, a lithographic and etching process is carried out to form a plurality of source contact windows 582 in the interlayer dielectric layer 580 to expose the source region 164 and the body region 162. A portion of the interlayer dielectric layer 580 on the bottom of the drain contact window 528, the gate dielectric layer 542, and the lightly doped region 537 on the second heavily doped region 536 are also removed in the present etching step. Then, an ion implantation step is carried out to form a heavily doped region 166 at the bottom of the source contact window 582. Although the conductive type of the heavily doped region 166 is opposite to that of the second heavily doped region 536, this ion implantation step would not generate significant influence to the conductivity of the exposed second heavily doped region 536 because the doping concentration of the implanted impurities is much lower than that of the second heavily doped region 536.

In the above mentioned embodiments, the base for forming the power semiconductor device is composed of a heavily doped substrate 100 and an epitaxial layer 110 formed thereon. However, the present invention is not so restricted. The heavily doped substrate 100 may be replaced by a lightly doped or an intrinsic substrate. In addition, the epitaxial layer 110 and the heavily doped substrate 100 may be replaced by a single lightly doped substrate as the base for forming the power semiconductor device.

In contrast with the fabrication method of the typical trenched MOSFET, the first heavily doped regions 132 formed below the bottom of the trenches 122,124 may be utilized as a conductive path extending to the edge of the epitaxial layer 110 for replacing the drain metal layer formed on the back side surface of the substrate so as to simply the fabrication process. The drain contact window located on the front side of the substrate also facilitates the proceeding of packaging processes. Moreover, the lightly doped regions 134 formed over the first heavily doped regions 132 are helpful for hindering the upward expansion of the first heavily doped regions 132 so as to prevent the dielectric layer between the gate structure and the epitaxial layer 110 from being punched through. In addition, in accordance with an embodiment of the present invention, the insulating layer 105 formed on the heavily doped substrate 100 may provide perfect electrical insulation protection for the semiconductor device.

Moreover, the power MOSFETs disclosed in the above mentioned embodiments are merely an example of the present invention. The present invention may be applied to the fabrication method of other power semiconductor devices, such as the IGBT. In detail, if the impurities with the conductive type identical to that of the body region are utilized for forming the first heavily doped region and the second heavily dope region, the present invention can be applied to IGBT.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A trenched power semiconductor device, comprising: a base;

a plurality of trenches, which include at least a gate trench, located in the base;

at least a gate polysilicon structure, located in the gate trench;

a gate dielectric layer, encircling a side surface and a bottom of the gate polysilicon structure;

a plurality of first heavily doped regions, located below at least some of the trenches and spaced from bottoms of the respective trenches with a lightly doped layer, and the first heavily doped regions being overlapped with each other to form a conductive path;

at least a body, encircling the gate trench and spaced from the first heavily doped region with a predetermined distance;

at least a source region, located in an upper portion of the body;

an interlayer dielectric layer, covering the gate polysilicon structure and having at least a source contact window therein to expose the source region;

a drain contact window, located near an edge of the base;

a second heavily doped region, locate below the drain contact window and electrically connected to the conductive path; and a metal layer, filling the drain contact window and electrically connected to the second heavily doped region.

2. The trenched power semiconductor device of claim 1, wherein the base is a lightly doped substrate.

3. The trenched power semiconductor device of claim 1, further comprising a plurality of lightly doped regions, located above the respective first heavily doped regions as the lightly doped layer.

4. The trenched power semiconductor device of claim 3, wherein the lightly doped regions have a conductive type identical to that of a neighboring portion of the base but with a smaller doping concentration.

5. The trenched power semiconductor device of claim 1, wherein the base comprising:

a substrate;

a lightly doped epitaxial layer, located on the substrate; and an insulating layer, interposed between the substrate and the lightly doped epitaxial layer.

6. The trenched power semiconductor device of claim 1, wherein the trenches are of substantially identical depth, and each of the trenches is with respect to one of the first heavily doped regions located therebelow.

7. The trenched power semiconductor device of claim 1, wherein the trenches are sorted into a first group and a second group, the first group of trenches has a greater depth in respect of the second group of trenches, and the first heavily doped regions are located below the first group of trenches respectively.

8. The trenched power semiconductor devices of claim 3, wherein the lightly doped region and the first heavily doped region are of an identical conductive type.

9. The trenched power semiconductor device of claim 1, wherein the interlayer dielectric layer covers a sidewall of the drain contact window.

* * * * *